(12) United States Patent
Liu (10) Patent No.: US 10,930,617 B2
(45) Date of Patent: Feb. 23, 2021

(54) PACKAGING METHOD AND PACKAGE STRUCTURE OF WAFER-LEVEL SYSTEM-IN-PACKAGE

(71) Applicant: Ningbo Semiconductor International Corporation, Ningbo (CN)

(72) Inventor: Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 59 days.

(21) Appl. No.: 16/208,307

(22) Filed: Dec. 3, 2018

(65) Prior Publication Data
US 2019/0115316 A1 Apr. 18, 2019

Related U.S. Application Data

(63) Continuation of application No. PCT/CN2018/093684, filed on Jun. 29, 2018.

(30) Foreign Application Priority Data

Sep. 30, 2017 (CN) .......................... 201710917071.1
Sep. 30, 2017 (CN) .......................... 201710919199.1
Jan. 24, 2018 (CN) .......................... 201810070263.8

(51) Int. Cl.
*H01L 23/02* (2006.01)
*H01L 25/065* (2006.01)
(Continued)

(52) U.S. Cl.
CPC ........ *H01L 25/0652* (2013.01); *H01L 21/486* (2013.01); *H01L 21/56* (2013.01);
(Continued)

(58) Field of Classification Search
CPC ..... H01L 2924/181; H01L 2224/32145; H01L 2224/96; H01L 2224/97; H01L 24/96; H01L 24/97; H01L 24/32
(Continued)

(56) References Cited

U.S. PATENT DOCUMENTS 5,280,192 A * 1/1994 Kryzaniwsky ........... G11C 5/00
257/691
5,811,879 A * 9/1998 Akram ................ H01L 25/0655
257/680
(Continued)

FOREIGN PATENT DOCUMENTS

CN 103077933 A 5/2013
CN 104347601 A 2/2015
(Continued)

*Primary Examiner* — S. V. Clark
(74) *Attorney, Agent, or Firm* — Anova Law Group, PLLC (57) ABSTRACT

The present disclosure provides a wafer-level system-in-package (WLSiP) packaging method and a WLSiP package structure. The WLSiP package structure includes a device substrate including a substrate and a plurality of first chips on the substrate, an encapsulation layer, covering the device substrate, a plurality of second chips embedded in the encapsulation; and an electrical connection structure, electrically connecting at least one of the plurality of second chips with at least one of the plurality of first chips. The plurality of first chips and the plurality of second chips are staggered from each other.

20 Claims, 6 Drawing Sheets

(51) Int. Cl.
*H01L 23/538* (2006.01)
*H01L 23/00* (2006.01)
*H01L 21/48* (2006.01)
*H01L 21/56* (2006.01)
*H01L 25/00* (2006.01)
*H01L 21/683* (2006.01)
*H01L 23/31* (2006.01)
*H01L 21/768* (2006.01)
*H01L 23/48* (2006.01)

(52) U.S. Cl.
CPC ........ *H01L 21/565* (2013.01); *H01L 21/6835* (2013.01); *H01L 21/76898* (2013.01); *H01L 23/3107* (2013.01); *H01L 23/3121* (2013.01); *H01L 23/481* (2013.01); *H01L 23/5384* (2013.01); *H01L 23/5386* (2013.01); *H01L 23/5389* (2013.01); *H01L 24/02* (2013.01); *H01L 24/09* (2013.01); *H01L 24/11* (2013.01); *H01L 24/16* (2013.01); *H01L 24/17* (2013.01); *H01L 24/19* (2013.01); *H01L 24/32* (2013.01); *H01L 24/80* (2013.01); *H01L 24/81* (2013.01); *H01L 24/83* (2013.01); *H01L 24/94* (2013.01); *H01L 24/96* (2013.01); *H01L 25/00* (2013.01); *H01L 25/50* (2013.01); *H01L 24/13* (2013.01); *H01L 24/20* (2013.01); *H01L 24/97* (2013.01); *H01L 2221/68381* (2013.01); *H01L 2224/02372* (2013.01); *H01L 2224/0345* (2013.01); *H01L 2224/1132* (2013.01); *H01L 2224/11334* (2013.01); *H01L 2224/11849* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/32145* (2013.01); *H01L 2224/80894* (2013.01); *H01L 2224/81005* (2013.01); *H01L 2224/81191* (2013.01); *H01L 2224/81815* (2013.01); *H01L 2224/81986* (2013.01); *H01L 2224/83005* (2013.01); *H01L 2224/8385* (2013.01); *H01L 2224/83896* (2013.01); *H01L 2224/92224* (2013.01); *H01L 2224/94* (2013.01); *H01L 2224/96* (2013.01); *H01L 2224/97* (2013.01); *H01L 2924/0105* (2013.01); *H01L 2924/01029* (2013.01); *H01L 2924/13091* (2013.01); *H01L 2924/1431* (2013.01); *H01L 2924/1461* (2013.01); *H01L 2924/181* (2013.01); *H01L 2924/3511* (2013.01)

(58) Field of Classification Search
USPC .................. 257/686, 777, 778, 787; 438/127
See application file for complete search history.

(56) References Cited

U.S. PATENT DOCUMENTS

| | | | | |
|---|---|---|---|---|
| 5,817,535 | A * | 10/1998 | Akram | H01L 23/13 438/15 |
| 5,998,860 | A * | 12/1999 | Chan | H01L 23/3107 257/679 |
| 7,524,699 | B2 * | 4/2009 | Fuergut | H01L 23/3128 257/686 |
| 2002/0125558 | A1 * | 9/2002 | Akram | H05K 1/144 257/686 |
| 2016/0118326 | A1 | 4/2016 | Kwon | |

FOREIGN PATENT DOCUMENTS

| | | |
|---|---|---|
| CN | 204179071 U | 2/2015 |
| CN | 104835808 A | 8/2015 |
| CN | 108346639 A | 7/2018 |

* cited by examiner

PACKAGING METHOD AND PACKAGE STRUCTURE OF WAFER-LEVEL SYSTEM-IN-PACKAGE

CROSS-REFERENCES TO RELATED APPLICATIONS

This application is a continuation application of PCT Patent Application No. PCT/CN2018/093684, filed on Jun. 29, 2018, which claims the priority to Chinese Patent Application Ser. No. 201810070263.8, filed on Jan. 24, 2018; Chinese Patent Application Ser. No. 201710917071.1, filed on Sep. 30, 2017; and Chinese Patent Application Ser. No. 201710919199.1 filed on Sep. 30, 2017, the content of all of which is incorporated herein by reference in their entirety.

TECHNICAL FIELD

The present disclosure relates to the field of semiconductor technology and, in particular, to a wafer-level system-in-package (WLSiP) packaging method and a WLSiP package structure.

BACKGROUND

System-in-package (SiP) combines multiple active components of different functions, as well as passive components, micro-electromechanical systems (MEMS), optical components and other components into one unit to form systems or subsystems providing various functions. It allows heterogeneous IC integration and is the best package integration technology. Compared to system on chip (SoC) package, SiP integration is relatively simpler, has shorter design cycle and time-to-market and lower costs, and can form more complicated systems.

Compared with conventional SiP, wafer level packaging (WLP) is a package integration process based on a wafer, which has advantages such as greatly reducing the area of the package structure, reducing manufacturing costs, optimizing electrical performance, and batch manufacturing, therefore can significantly reduce workload and equipment needs.

Given the significant advantages of wafer level packaging, how to better implement wafer level packaging has been a hot research topic in the industry.

SUMMARY

A series of simplified forms of concepts are introduced in this SUMMARY section, which may be described in further detail in DETAILED DESCRIPTION section. The SUMMARY section of this disclosure is not intended to define key features and essential technical features of claimed embodiments, and is not intended to determine scope of protection of the claimed embodiments.

One aspect of the present disclosure provides a wafer-level system-in-package (WLSiP) package structure, including a device substrate including a substrate and a plurality of first chips grown on the substrate; an encapsulation layer covering the substrate and the plurality, of first chips; a plurality of second chips embedded in the encapsulation layer and an electrical connection structure, electrically connecting at least one second chip of the plurality of second chips with at least one first chip of the plurality of first chips. The plurality of first chips and the plurality of second chips are staggered from each other.

Another aspect of the present disclosure provides a wafer-level system-in-package (WLSiP) packaging method, including providing a device substrate, including a substrate and a plurality of first chips on the substrate; providing a plurality of second chips on the substrate, that the plurality of second chips and the plurality of first chips are staggered; forming an electrical connection structure, such that at least one of the plurality of second chips is electrically connected to at least one of the plurality of first chips; and covering the plurality of second chips and the substrate with an encapsulation material, to fix the plurality of second chips on the substrate.

Other aspects of the present disclosure can be understood by those skilled in the art in light of the description, the claims, and the drawings of the present disclosure.

BRIEF DESCRIPTION OF THE DRAWINGS

The following drawings of the present disclosure are hereby incorporated by reference to the extent of the present disclosure. The embodiments of the present disclosure and the description thereof are shown in the drawings. In the drawings.

DETAILED DESCRIPTION

In the following description, numerous specific details are set forth to provide a more thorough understanding of the disclosure. However, it may be apparent to those skilled in the art that the present disclosure may be practiced without one or more of these details. In other embodiments, some technical features well known in the art have not been described in order to avoid confusion with the present disclosure.

It should be understood that the disclosure can be embodied in various forms and should not be construed as limited to the embodiments set forth herein. Rather, these embodiments are provided so that this disclosure may be thorough and complete, and the scope of the disclosure may be conveyed to those skilled in the art. In the drawings, the size and relative dimensions of the layers and regions may be exaggerated for clarity. The same reference numerals indicate the same elements throughout.

It should be understood that when an element or layer is referred to as "on", "adjacent", "connected to" or "coupled" to another element or layer, it can be directly on, adjacent, connected or coupled to another element or layer, or there can be other elements or layers in between. In contrast, when an element is referred to as "directly on", "directly adjacent", "directly connected" or "directly coupled" to another element or layer, there are no other elements or layers in between. It should be understood that though the terms of the first, second, third, etc., are used to describe the elements, components, regions, layers and/or sections, those elements, components, regions, layers and/or sections may not be limited by the terms of the first, second, third, etc. The terms are just used to distinguish one element, component, region, layer or section to another element, component, region, layer or section. Thus, a first element, component, region, layer or section, which is discussed below, may be referred to as a second element, component, region, layer or section, without departing from the scope of the present disclosure.

Spatial relationship terms such as "under", "below", "on", "above", etc., may be used to describe the relationship of one element or feature shown in the figures to other elements or features. It should be understood that the spatially relative terms are intended to encompass different orientations of the device in use and operation, in addition to the orientation shown in the figures. For example, if the device in the figures is turned, then "below" or "under" the element or feature may become "above" or "on" the element or feature. Thus, the illustrative terms "below" and "under" can include both the above and the below orientations. The device may be otherwise oriented (rotated 90 degrees or other orientation) and the spatial descriptors used herein shall be interpreted accordingly.

The terminology used herein is for the purpose of describing the particular embodiments and is not the limit of the present disclosure. The singular forms "a", and the are also intent to include plural form, unless otherwise stated in the context. The term "composition" and/or "comprising", when used in the specification, is used to determine the presence of the features, integers, steps, operations, elements and/or components, but does not exclude the presence or addition of one or more other features, integers, steps, operations, elements and/or components. As used herein, the term "and/or" includes any and all combinations of the associated listed items.

Embodiments of the disclosure are described herein with reference to cross-section illustrations of schematic representations of the preferred embodiments (and intermediate structures) of the disclosure. Thus, variations from the shapes shown may be expected as a result, for example, of manufacturing techniques and/or tolerances. Thus, embodiments of the disclosure shall not be limited to the specific shapes of the regions illustrated herein, but shall include variations in the shape, for example, a shape variation due to manufacturing. For example, an implanted region shown as a rectangle typically has rounded or curved features and/or implanted concentration gradients at its edges rather than a binary change from implanted to non-implanted regions. Likewise, a buried region formed by implantation can result in some implantation in the region between the buried region and the surface through which the implantation takes place. The regions shown in the figures are therefore schematic in nature and their shapes are not intended to show the actual shape of the regions of the device and are not intended to limit the scope of the present disclosure.

In order to fully understand the present disclosure, detailed steps and structures are set forth in the following description in order to explain the disclosure. Exemplary embodiments of the present disclosure are described in detail below, but the present disclosure may have other embodiments in addition to the detailed descriptions below.

The present disclosure provides a wafer-level system-in-package (WLSiP) package structure. An exemplary WLSiP package structure may include a device substrate including a substrate and a plurality of first chips formed on the substrate, an encapsulation layer covering the device substrate including the substrate and the plurality of first chips, a plurality of second chips embedded in the encapsulation layer, and an electrical connection structure, electrically connecting at least one of the plurality of second chips with at least one of the plurality of first chips. The plurality of first chips and the plurality of second chips are staggered from each other.

The WLSiP package structure of the present disclosure includes a device substrate, for example, including a substrate having a plurality of first chips formed thereon by a semiconductor process, an encapsulation layer having a plurality of second chips embedded therein and together covering the device substrate including the substrate and the plurality of first chips, and an electrical connection structure, electrically connecting at least one of the plurality of second chips with at least one of the plurality of first chips. As such, integrating the plurality of first chips with the substrate by a semiconductor process, with the plurality of second chips in the WLSiP package structure, can greatly reduce the area of the WLSiP package structure and provide better electrical performance. In other embodiments, the device substrate may include a silicon-on-insulator (SOI) substrate with first chips formed therein.

Exemplary Embodiment 1

An exemplary package structure of the present disclosure may be illustrated and explained below with reference to FIG. 1F.

For example, the WLSiP package structure includes a device substrate including a substrate 100 and a plurality of first chips 101 formed on the substrate 100 using a semiconductor process.

In one embodiment, the WLSiP package structure also includes an encapsulation layer 102 having a plurality of second chips 201 embedded therein. The encapsulation layer 102 covers the substrate 100 and the plurality of first chips 101.

Optionally, at least one second chip of the plurality of second chips 201 is electrically connected to at least one first chip of the plurality of first chips 101.

Figure 1A:
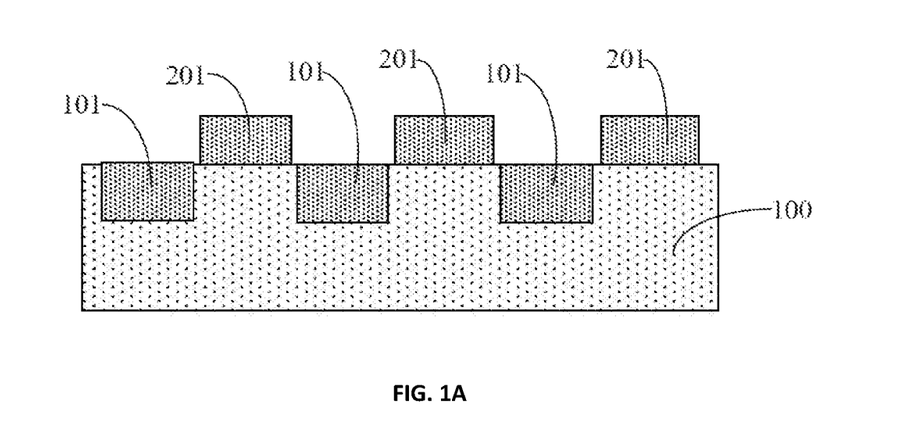
FIGS. 1A to 1F are schematic cross-sectional views of structures corresponding to certain stages of an exemplary method for forming a package structure consistent with various embodiments of the present disclosure.
Figure 1B:
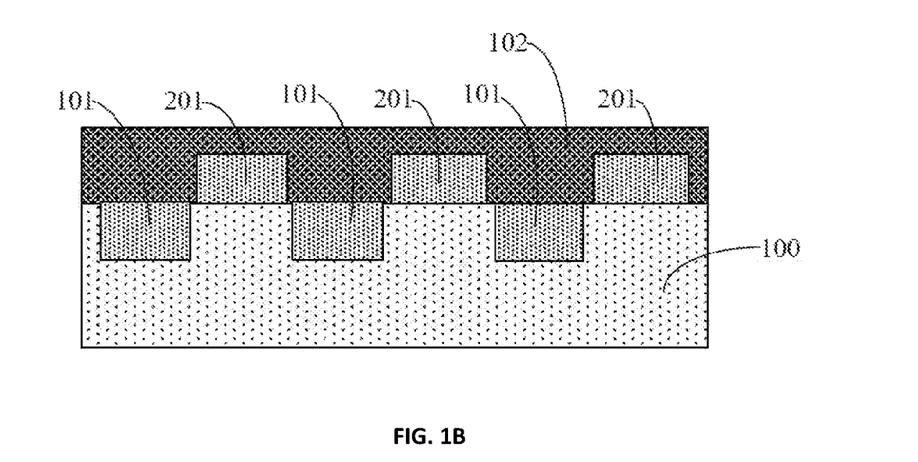
Figure 1C:
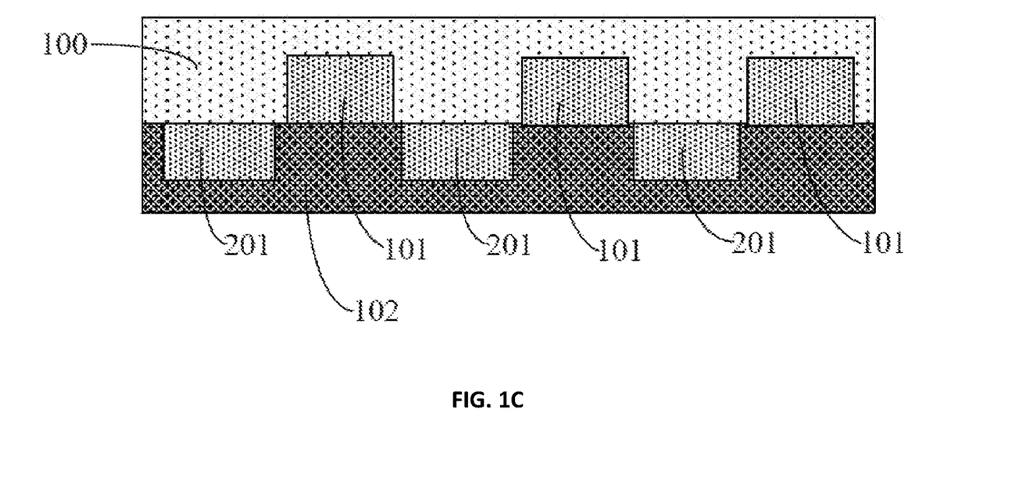
Figure 1D:
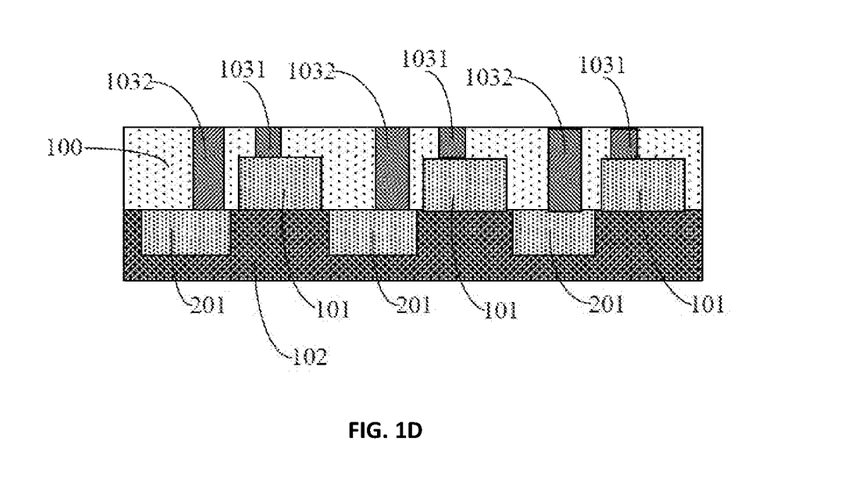
Figure 1E:
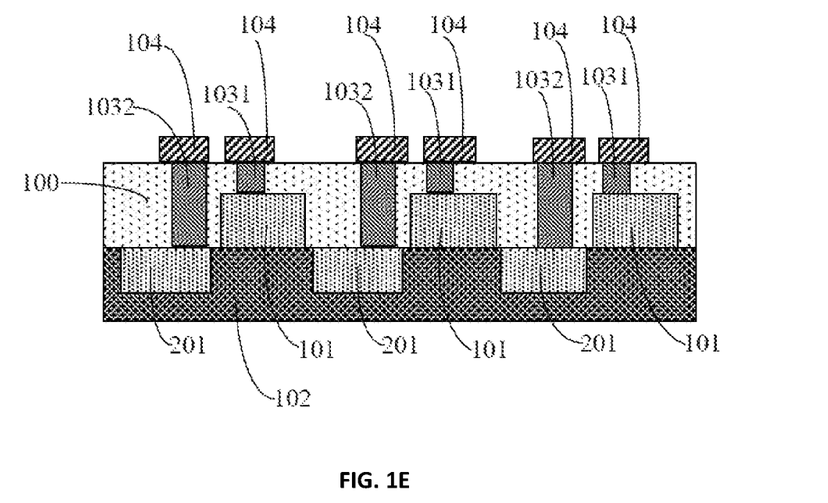
Figure 1F:
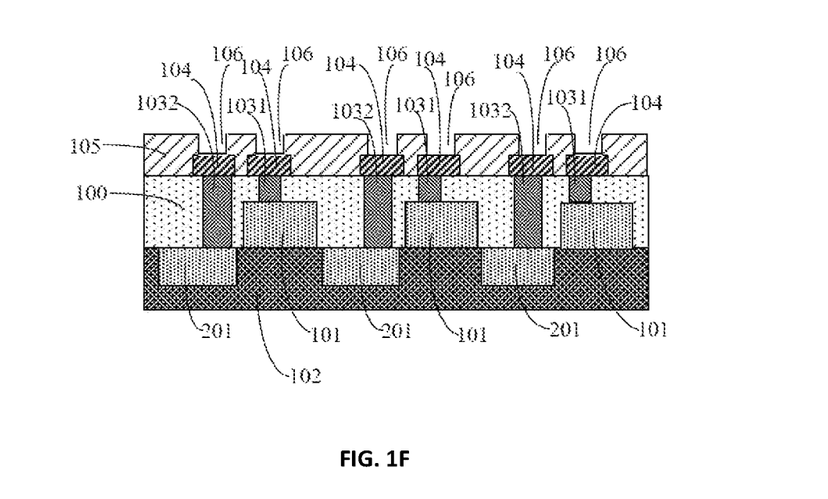

In one embodiment, as shown in FIG. 1F, the plurality of first chips 101 and the plurality of second chips 201 are staggered from each other. For example, the plurality of first chips 101 and the plurality of second chips 201 are staggered from each other in the top view, and the plurality of first chips 101 and the plurality of second chips 201 are electrically connected by an electrical connection structure.

In one example, the electrical connection structure includes: plugs 1031 and plugs 1032 that are located in the substrate 100 and are electrically connected to the plurality of first chips 101 and the plurality of second chips 201, respectively.

In one example, the plugs 1031 corresponding to the plurality of first chips 101 are electrically connected to the plurality of first chips 101, and the plugs 1032 corresponding to the plurality of second chips 201 are electrically connected to the plurality of second chips 201.

In one example, as shown in FIG. 1F, a front side of the plurality of second chips 201 is bonded to the substrate 100.

In another example, a back side of the second chips may be bonded to the substrate, and the specific bonding mode may be selected according to actual process requirements.

The plurality of second chips 201 are disposed on a substrate region outside the plurality of first chips 101 such that, in a specific embodiment, the plurality of second chips 201 and the plurality of first chips 101 are completely staggered from each other.

In one example, the plurality of second chips 201 is disposed on the substrate 100 by a bonding layer (not shown). For example, a bonding layer is disposed between the plurality of second chips and the substrate (not shown), and the plurality of second chips 201 is bonded to the substrate 100.

In one example, the encapsulation layer 102 covers the substrate 100 and the plurality of first chips 101 and embeds the plurality of second chips 201 within the encapsulation layer 102.

Optionally, as shown in FIG. 1F, the substrate 100 has a front side and a back side, and the encapsulation layer 102 covers the front side.

In another example, the substrate has a front side and a back side, and the encapsulation layer covers the back side, that is, the encapsulation layer covers a side of the substrate on which the plurality of second chips is disposed.

A top surface of the encapsulation layer 102 is higher than a top surface of the plurality of second chips 201. The encapsulation layer 102 plays a role to fix the plurality of second chips 201 on the substrate 100 and can provide physical and electrical protection against external interference.

In one example, as shown in FIG. 1F, when a bonding layer is disposed between the substrate 100 and the plurality of second chips 201, the plugs 1032 corresponding to the plurality of second chips 201 sequentially penetrate the substrate 100 and the bonding layer and are electrically connected to the plurality of second chips 201, and the plugs 1031 penetrate a portion of the substrate 100 and are electrically connected to the plurality of first chips 101.

In another example, when the encapsulation layer covers a back side of the substrate, the plurality of second chips may also be electrically connected with the plurality of first chips via plugs corresponding to the plurality of second chips and a rewiring formed on a front side of the substrate.

In one example, the WLSiP package structure further includes pads 104 that are located on the other side of the substrate 100 with respect to the encapsulation layer 102.

In one example, the package structure further includes a passivation layer 105 having openings 106. The passivation layer 105 covers the pads 104 and the substrate 100, and the openings 106 expose the pads 104.

Optionally, a top surface of the passivation layer 105 is higher than a top surface of the pads 104. Thickness of the passivation layer may be any suitable thickness, which is not limited herein.

The disclosed substrate may be at least one of the following semiconductor materials: Si, Ge, SiGe, SiC, SiGeC, InAs, GaAs, InP, InGaAs, and other Group III-V compound semiconductors. The substrate may also be a multilayer structure including, for example, silicon-on-insulator (SOI), silicon-on-insulator laminate (SSOI), laminated silicon-germanium-on-insulator (S—SiGeOI), silicon germanium-on-insulator (SiGeOI), germanium-on-insulator (GeOI) and the like. The substrate 100 may also be other suitable substrate structures, and the substrate 100 may also be a single-layer structure or multi-layered structure (e.g., including two or more layers).

The chips, for example, the plurality of first chips 101 and the plurality of second chips 201, may be any one of semiconductor chips, which may include active devices such as memories, logic circuits, power devices, bipolar devices, separate MOS transistors, and microelectromechanical systems (MEMS); photovoltaic devices such as light-emitting diodes; and passive devices such as resistors, capacitors, and the like. In some embodiments, the plurality of first chips 101 is grown on the substrate by a semiconductor process. In other embodiments, the plurality of first chips 101 is bonded onto, or otherwise attached with, the substrate. Functions of the plurality of first chips can be different. Therefore, the corresponding semiconductor process used can be different. In this way, reliability is higher, and more processes can be saved.

For illustration purposes, the plurality of first chips 101 is simply shown in a form of boxes, but it is conceivable that elements of the plurality of first chips may include a plurality of constituent elements and a rewiring (e.g., metal interconnect structure) that make the plurality of first chips accessible, etc. The metal interconnect structure may include a plurality of metal layers and contact holes/vias electrically connecting adjacent metal layers. A plurality of dielectric layers can be formed on the substrate during the growth of the plurality of first chips, therefore the adjacent first chips 101 may be separated by the dielectric layers formed on the substrate to form a structure similar to that shown in FIG. 1F, in which each of the plurality of first chips 101 is embedded in a surface of the substrate.

In one example, the material of the dielectric layer can be any suitable dielectric material including, but not limited to, one of $SiO_2$, fluorocarbon (CF), carbon doped silicon oxide (SiOC), and silicon carbonitride (SiCN).

The plurality of first chips 101 may have the same or different functions. The plurality of first chips 101 may have the same or different sizes. The actual number, function and size of the plurality of first chips 101 are determined by design requirements and are not limited.

Alternatively, the plurality of second chips 201 can be a different type of chips having a different function from the plurality of first chips 101, and also can be the same chips.

Optionally, the bonding layer may be a double-sided adhesive layer. One side of the bonding layer is bonded to the surface of the substrate 100, and the other side is bonded to the surface of the plurality of second chips 201 to bond the plurality of second chips 201 on the substrate to realize a physical connection between the plurality of second chips 201 and the substrate 100.

The bonding layer may be formed only in a region where the substrate is intended to be used to fix the plurality of second chips, or the bonding layer may also be formed over the entire substrate.

Optionally, the bonding layer may be an organic film, which may include various organic film layers, such as a die attach film (DAF), a dry film, a photoresist, etc. Thickness of the bonding layer is set as needed, and number of layers of the bonding layers is not limited for a multi-layered bonding layer.

The die attach film (DAF) may be any suitable material such as a resin glue, for example, a highly thermally conductive resin glue.

The dry film is a polymer compound which, after being irradiated by ultraviolet rays, can generate a polymerization reaction to form a stable substance attached to the surface of the substrate, to be bonded to the plurality of second chips. In one embodiment, the dry film can include three layers: a polyethylene (PE) protective film, a polyethylene terephthalate (PET) protective layer, and a dry film layer sandwiched between the PE protective film and the PET protective layer.

The thickness of the bonding layer can be appropriately set according to the requirements of the device, and is not particularly limited herein, as long as any thickness allows the plurality of second chips to be firmly fixed on the substrate.

In one example, the encapsulation layer 102 can be any suitable encapsulation material. For example, the encapsulation layer 102 is a plastic encapsulation layer, and the plastic encapsulation layer includes a thermosetting resin. The thermosetting resin can be softening or flowing to have plasticity and be made into a certain shape during a molding process. During the same molding process, chemical reaction occurs and cross-linking cures in the thermosetting resin. The plastic encapsulation layer can include at least one of the thermosetting resins such as phenolic resin, urea-formaldehyde resin, melamine-formaldehyde resin, epoxy resin, unsaturated resin, polyurethane, polyacyl, etc. The epoxy resin may be used as the plastic encapsulation layer. The epoxy resin may be one of an epoxy resin with a filler material and an epoxy without a filler material. The epoxy resin may include various additives, including for example, a curing agent, a modifier, a mold release agent, a thermochromic agent, a flame retardant, etc. In one embodiment, a phenol resin is used as the curing agent, and solid particles, for example, silicon fine powder, and the like are used as the filler material. Optionally, the plastic encapsulation layer may also include silica gel.

The plugs 1031 and the plugs 1032 can be any suitable metal plugs or silicon plugs (e.g., through silicon via, TSV). Material of the metal plugs can include, but is not limited to, Ag, Au, Cu, Pd, Cr, Mo, Ti, Ta, Sn, W, and Al. Material of the silicon plugs may include doped polysilicon, undoped polysilicon, and the like.

In one example, the pads 104 are electrically connected to corresponding plugs. Material of the pads 104 may be any suitable metal material including, but not limited to, Ag, Au, Cu, Pd, Cr, Mo, Ti, Ta, Sn, W, and Al.

The passivation layer 105 may be made of any suitable insulating material. For example, the passivation layer 105 can be made of an inorganic insulating layer such as a silicon oxide layer, a silicon nitride layer, and a silicon oxynitride layer. The passivation layer 105 can be deposited by a deposition method such as chemical vapor deposition, physical vapor deposition and atomic layer deposition. An insulating layer such as a layer of polyvinylphenol, polyimide, siloxane and the like may also be used. Polyvinylphenol, polyimide, and siloxane can be effectively formed by one of a droplet discharge method, a printing method, and a spin coating method. Siloxanes can be classified according to their structures into silica glass, alkylsiloxane polymers, alkylsilsesquioxane polymers, silsesquioxane hydride polymers, alkylsilsesquioxane hydride polymer, and the like. Further, the insulating material may be formed of a material of a polymer having a Si—N bond (polysilazane). Further, these films may be laminated to form the passivation layer.

In various embodiments, other components may be included in the disclosed package structure without limitation.

In this manner, a plurality of first chips is integrated with a plurality of second chips in a WLSiP package structure, which greatly reduces the area of the WLSiP package structure and provides better electrical performance. The formed WLSiP package structure may then have improved performance.

Exemplary Embodiment 2

The present disclosure also provides another exemplary WLSiP package structure, as illustrated and explained below with reference to FIG. 2E.

As an example, the WLSiP package structure of the present disclosure includes a substrate 300 having a plurality of first chips 301 that are grown on the substrate 300 by using a semiconductor process.

In one example, the WLSiP package structure of the present disclosure further includes an encapsulation layer 402 having a plurality of second chips 401 embedded therein. The encapsulation layer 402 covers the substrate 300 and the plurality of first chips 301.

Optionally, the substrate 300 has a front side and a back side, and the encapsulation layer 402 covers the front side.

In another example, the substrate has a front side and a back side, and the encapsulation layer covers the back side, that is, the encapsulation layer covers a surface of the substrate on which the plurality of second chips is disposed.

Further, the WLSiP package structure of the present disclosure further includes an electrical connection structure, through which at least one second chip of the plurality of second chips 401 is electrically connected to at least one first chip of the plurality of first chips 301. The plurality of first chips 301 and the plurality of second chips 401 are staggered from each other.

In one example, the electrical connection structure includes plugs 302, that are located in the substrate 300 and are electrically connected to the plurality of first chips 301, and a rewiring (not shown) that is located between the plurality of first chips 301 and the plurality of second chips 401, or at the top of the plugs 302.

Optionally, at least one plug of the plugs 302 is disposed in at least one first chip of the plurality of first chips 301 and the at least one plug of the plugs 302 penetrates the at least one first chip of the plurality of first chip 301. For example, the at least one plug of plugs 302 penetrate the at least one first chip of the plurality of first chips 301, as well as the front and back sides of the substrate 300, and are electrically connected to first pads 305 formed on the back side of the substrate 300.

In another example, plugs penetrate the plurality of first chips 301, as well as a front and back sides of the substrate, and are electrically connected to first pads 305 formed on the front side of the substrate, which can be properly set depending on the actual package structure.

Optionally, the plugs 302 are disposed in an edge region of the plurality of first chips 301, or other suitable region capable of electrically connecting to the plurality of first chips 301 without affecting the functional realization of the plurality of first chips 301.

Further, the electrical connection structure further includes conductive bumps 304 formed between the rewiring and the plurality of second chips 401.

Optionally, the conductive bumps 304 are arranged in an array. The conductive bumps 304 may be tin balls, copper pillars, gold bumps, alloy bumps, and the like. The conductive bumps 304 can also be other suitable conductive bump structures.

The conductive bumps 304 mainly include a metal material including, but not limited to, at least one of tin, copper, nickel, silver tin copper alloy, and tin-based alloy.

In another example, conductive bumps may also be disposed on the substrate, but positions thereof are staggered from positions of the plurality of first chips, and the conductive bumps are electrically connected to the rewiring which is electrically connected to the plurality of first chips. The plurality of second chips is disposed on the conductive bumps, thus the plurality of first chips and the plurality of second chips are electrically connected by the conductive bumps and the rewiring.

In one example, the package structure further includes second pads 303 that are located on the front side of the substrate 300 and are electrically connected to the plurality of first chips 301.

In one example, when the plurality of first chips 301 and the plurality of second chips 401 are staggered from each other, the second pads 303 may also be disposed between the plurality of second chips 401 and the substrate 300. The second pads 303 may electrically connect the rewiring which is electrically connected to the plurality of first chips 301. Thus the second pads 303 realize the electrical connection of the plurality of first chips 301 and the plurality of second chips 401.

In one example, the conductive bumps 304 are disposed on the second pads 303 and are electrically connected to the second pads 303.

In one example, an under bump metallization (UBM) structure (not shown) may also be disposed between the second pads 303 and the conductive bumps 304. The under bump metallization (UBM) structure may be formed by stacking multi-layer metals of a bonding layer, a barrier layer, and one of a seed layer and a wetting layer. The UBM structure helps prevent diffusion between the bumps and integrated circuit of multi-chip semiconductor devices while providing a low resistance electrical connection.

In one example, the package structure further includes the first pads 305 on the other side of the substrate 300 with respect to the encapsulation layer 402. The first pads 305 are electrically connected to the corresponding plugs 302.

Optionally, when the encapsulation layer 402 covers the front side of the substrate 300, the first pads 305 may be disposed on the back side of the substrate 300. When the encapsulation layer 402 covers the back side of the substrate 300, the first pads 305 may be disposed on the front side of the substrate 300.

In one example, the package structure further includes a passivation layer 306 having openings 307. The passivation layer 306 covers the first pads 305 and the substrate 300, and the openings 307 expose the first pads 305.

The solutions in this embodiment and the foregoing embodiments may also be cross-referenced. For the purpose of avoiding repetition, reference may be made to the foregoing embodiments for the explanation and description of the same structures and film layers and the like, and the details are not described herein.

Exemplary Embodiment 3

Figure 3:
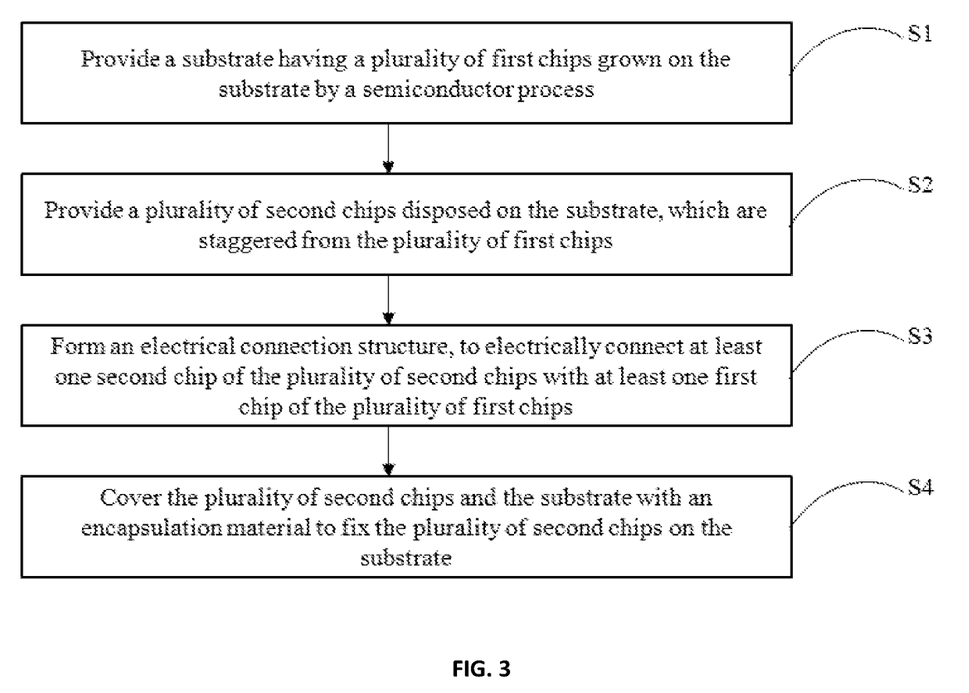
FIG. 3 is a flow chart of an exemplary WLSiP packaging method consistent with various embodiments of the present disclosure.

The present disclosure provides an exemplary improved WLSiP packaging method, as shown in FIG. 3, which includes following exemplary steps:

In S1, providing a substrate having a plurality of first chips grown on the substrate by a semiconductor process; In S2, providing a plurality of second chips disposed on the substrate, which are staggered from the plurality of first chips; In S3, forming an electrical connection structure, to electrically connect at least one second chip of the plurality of second chips with at least one first chip of the plurality of first chips; and in S4, covering the plurality of second chips and the substrate with an encapsulation material to fix the plurality of second chips on the substrate.

The WLSiP packaging method of the present disclosure combines wafer level system packaging and system packaging method, and realizes advantages of integration of various chips and packaging manufacturing on a wafer. It has advantages to greatly reduce the area of a package structure, reduce manufacturing cost, optimize electrical performance, batch manufacturing and others, and it can significantly reduce workload and equipment requirements, and improve efficiency and yield of packaging. A package structure obtained by the WLSiP packaging method of the present disclosure also has higher performance and yield.

For example, the WLSiP packaging method of the present disclosure may be described in details with reference to FIGS. 1A to 1F. FIG. 1A to FIG. 1F are schematic cross-sectional views of package structures corresponding to certain stages of an exemplary packaging method to form a package structure consistent with various embodiments of the present disclosure.

As an example, the exemplary packaging method can be used for formation of the package structure in the first embodiment. The WLSiP packaging method of the present disclosure includes the following two exemplary steps.

First, step one is performed, as shown in FIG. 1A. The substrate 100 having the plurality of first chips 101 thereon is provided. Descriptions of the specific structure and the like of the plurality of first chips 101 and the substrate 100 are described with reference to the description in the first embodiment, and are not described herein.

Then, step two is performed to continue, as shown in FIG. 1A. A plurality of second chips 201 are provided, the plurality of second chips 201 are disposed on the substrate 100, and the plurality of second chips 201 and the plurality of first chips 101 are staggered. For description of type and the like of the plurality of second chips 201, reference may be made to the foregoing first embodiment, and details are not described herein.

Alternatively, the plurality of second chips 201 may be a different type of chips having different functions from the plurality of first chips 101 and may be the same chips.

In one example, front sides of the plurality of second chips 201 are bonded to the substrate 100.

In another example, back sides of the plurality of second chips and the substrate are bonded with each other, and specific bonding manner can be selected according to actual process requirements.

The plurality of second chips 201 are disposed in a region of the substrate outside the plurality of first chips 101, so that the plurality of second chips 201 and the plurality of first chips 101 are completely staggered to facilitate execution of subsequent plugging process.

A method of disposing the plurality of second chips to the substrate can be any suitable method, and in one example, the method of disposing the plurality of second chips 201 to the substrate 100 includes the following exemplary steps: forming a bonding layer (not shown) on the substrate 100 to bond the plurality of second chips 201 to the substrate.

The bonding layer may be a double-sided adhesive layer. One side is bonded to the surface of the substrate 100, and the other side is bonded to the surface of the plurality of second chips 201 to fix the plurality of second chips 201 to the substrate, to implement the physical connection between the plurality of second chips 201 to be integrated and the substrate 100.

The bonding layer may be formed only in a region of the substrate intended to be used to fix the plurality of second chips and may also be formed in the entire substrate.

In another example, the following exemplary steps A1 to A4 may also be included before the plurality of second chips is disposed on the substrate.

First, step A1 is performed to thin the back side of the substrate. The thinning of this step may be performed using any suitable process, such as a mechanical grinding process, a chemical mechanical polishing process, and an etching process. Thickness of the thinned substrate can be reasonably set according to an actual process. For example, the thickness of the thinned substrate 100 is between about 10 μm and about 100 μm, and the thickness may vary according to the technical nodes without limitations.

Next, step A2 is performed to provide a support substrate for bonding the support substrate to the back side of the substrate. The support substrate may be any suitable substrate, such as a semiconductor substrate, a glass substrate, a ceramic substrate, and the like. The support substrate is bonded to the back side of the substrate, and the bonding may be performed using any suitable bonding means such as a temporary bonding. For example, a bonding adhesive layer can be used to bond the support substrate and the back side of the substrate. The bonding adhesive layer may be, but is not limited to, an organic polymer material and an ultraviolet-densable organic material.

Next, step A3 is performed to place the plurality of second chips on the front side of the substrate. The method of placing the plurality of second chips may be any suitable method known to those skilled in the art, preferably using the method described in the foregoing steps. The plurality of second chips is placed onto the substrate, for example by bonding.

Next, step A4 is performed to remove the support substrate. To remove the support substrate, a suitable removal method is selected according to the bonding method used. For example, using one of high temperature and ultraviolet irradiation, the bonding layer is denatured with reduced viscosity, and the support substrate can be peeled off. The removal of the support substrate can also be performed after the step of covering the plurality of second chips and the substrate with the encapsulation material to fix the plurality of second chips on the substrate.

Next, step three is performed, as shown in FIG. 1B. An encapsulation material covers the plurality of second chips 201 and the substrate 100 to fix the plurality of second chips 201 on the substrate 100.

Optionally, the encapsulating material may covers the plurality of second chips 201 and the substrate 100 by using an injection molding process, which may be one of a hot press molding process, and other suitable injection molding processes.

Optionally, the injection molding process uses one of a liquid mold compound and a solid mold compound. A liquid mold compound is preferably used so that the liquid mold compound can fill in gaps between adjacent conductive bumps before curing, that is, the gaps between the plurality of first chips and the plurality of second chips; therefore adhesion between the plurality of first chips and the plurality of seconds chip is increased, and stability of the package is improved.

In one example, steps of covering the plurality of second chips and the substrate with an encapsulation material includes: providing a mold and placing the substrate in the mold. The mold can be any suitable mold without limitations. A mold compound in molten state is then injected into the mold. The liquid mold compound is uniformly applied to the entire substrate to wrap the plurality of second chips 201. A curing process may be implemented, so that the mold compound is solidified to form a plastic sealing layer as the encapsulating layer 102. The curing process may be a thermal curing process, and a specific curing method can be appropriately selected according to the actually used mold compound. Demolding may then be performed.

Optionally, the top surface of the encapsulation layer 102 is higher than the top surface of the plurality of second chips 201, and the encapsulation layer 102 provides physical and electrical protection to the plurality of second chips from external interference.

In one example, the substrate 100 has a front side and a back side, and the encapsulation layer 102 covers the front side, and the plurality of second chips 201 is disposed over the front side of the substrate.

In one example, the substrate has a front side and a back side, and the encapsulation layer 102 covers the back side, at which time the plurality of second chips 201 is disposed on the back side of the substrate 100.

In one example, as shown in FIG. 1C, after the encapsulation material covers the plurality of second chips and the substrate, further steps include a step of thinning the back side of the substrate. This thinning step is usually performed when a process of thinning the back side of the substrate is not performed before the plurality of second chips is placed on the substrate.

Next, step four is performed to form an electrical connection structure, such that at least one second chip of the plurality of second chips is electrically connected to at least one first chip of the plurality of first chips.

Optionally, as shown in FIG. 1D, plugs 1031 and plugs 1032 are formed in the substrate. The plugs 1031 corresponding to the plurality of first chips 101 are electrically connected to the plurality of first chips 101. The plugs 1032 corresponding to the plurality of second chips 201 are electrically connected to the plurality of second chips 201. Ends of the plugs 1031 and the plugs 1032 are exposed from the back side of the substrate 100.

For example, the plugs 1031 are used to realize the electrical connection between the plurality of first chips 101 and an external circuit, and the plugs 1032 are used to implement the electrical connection between the plurality of second chips 201 and an external circuit. It is shown in FIG. 1D that only one of the plurality of first chips 101 is electrically connected to one of the plugs 1031, and only one of the plurality of second chips 201 is electrically connected to one of the plugs 1032, however others cases where a plurality of plugs are electrically connected to each of chips can also apply in present disclosure.

The plugs 1031 and the plugs 1032 can be formed using any suitable method. In one example, when the plurality of second chips is bonded to the substrate by a bonding layer, steps to form the plugs 1031 and the plugs 1032 includes the following exemplary steps.

Firstly, forming a patterned mask layer (not shown) on the other side of the substrate with respect to the encapsulation layer. The plugs are defined in the patterned mask layer, and the mask layer may include any of a plurality of mask materials including, but not limited to, one of a hard mask material and a photoresist mask material. For example, the mask layer uses the photoresist mask material. The photoresist mask material can be patterned by spin-coating on the back side of the substrate, and then being patterned by using a photolithography process to form a patterned photoresist mask material. Positions and critical dimensions of the plugs, and the plugs to be formed are defined in the patterned photoresist mask material.

Then, etching a portion of the substrate 100 by using the patterned mask layer as a mask until a portion of the plurality of first chips is exposed to form via holes, and etching a portion of the substrate and the bonding layer until a portion of the plurality of second chips is exposed to form via holes. The etching process may be one of a wet etching and a dry etching process. A dry etching process is preferably used. Dry etching includes, but is not limited to, one of reactive ion etching (RIE), ion beam etching, plasma etching, and laser cutting.

Then, removing the patterned mask layer, for example, by using ashing to remove the photoresist mask material.

Then, forming a conductive material, for example, a metal material or polysilicon, to fill the via holes to form the plugs 1031 and the plugs 1032. The conductive material is formed by using one of physical vapor deposition (PVD), chemical vapor deposition (CVD), sputtering, electrolytic plating, electroless plating, and other suitable metal deposition process.

When bonding of the plurality of second chips and the substrate is achieved by the bonding layer, and the via holes are formed by using etching, the composite film (e.g., the substrate and the bonding layer) must be etched through to realize the electrical connection. The bonding layer is usually an organic thin film, and an exemplary substrate may include various inorganic film layers, for example, including a semiconductor substrate and a dielectric layer. The dielectric layer is, for example, one of a silicon oxide layer and a silicon nitride layer. Number of the inorganic film layers is not limited to one, and two and more layers may be used. The substrate may be etched by using dry etching, for example, an etching method using a fluorine-containing gas such as $CF_4$ as an etching gas, and then the bonding layer (e.g., an organic film) can be etched using Oxygen or argon as the etching gas.

Optionally, the plugs 1031 extend from the back side of the substrate 100 to the front side until they are electrically connected to the corresponding plurality of first chips 101. The plugs 1032 extend from the back side of the substrate 100 to the front side until they are electrically connected to the corresponding plurality of second chips 201.

The above method is equally applicable to the embodiment where the plurality of second chips is placed on the back side of the substrate.

Optionally, before the plurality of second chips is placed on the back side of the substrate, the back side of the substrate may be thinned. Subsequently, the plurality of second chips is placed on the back side of the substrate, and the encapsulation material covers the plurality of second chips and the substrate. After that, the plugs are formed in the substrate. The plugs corresponding to the plurality of first chips is electrically connected to the plurality of first chips and the plugs corresponding to the plurality of second chips is electrically connected to the plurality of second chips.

In one example, after the plugs are formed, the process of performing the following steps B1 to B3 is further performed. First, step B1 is performed, as shown in FIG. 1E, to form pads 104 on the substrate. The pads 104 are located on the other side of the substrate 100 with respect to the plurality of second chips 201 and are electrically connected to the plugs 1031 and the plugs 1032.

Optionally, the pads 104 electrically connect at least one plug of the plugs 1031 and at least one plug of the plugs 1032. The pads 104 are electrically connected to the plugs to achieve electrical connection between the plurality of first chips and the plurality of second chips.

Optionally, the pads are used to connect the plurality of first chips and the plurality of second chips to the external circuit, and one pad of the pads 104 may be disposed on each plug of the plugs 1031 and each plug of the plugs 1032 to implement the pads 104 electrically connected to each chip independently. One pad of the pads 104 may also be electrically connected to a plurality of the plugs 1031, and one pad of the pads 104 is electrically connected to a plurality of the plugs 1032. One pad of the pads 104 can also be electrically connected to at least one plug of the plugs 1031 and at least one plug of the plugs 1032, to achieve more functional connections.

The pads 104 may be formed using any suitable method. For example, form a pad material layer to cover the back side of the substrate 100. One of physical vapor deposition (PVD), chemical vapor deposition (CVD), sputtering, electrolytic plating, electroless plating, and other suitable metal deposition process may be used to form the pad material layer. After that remove a portion of the pad material layer by etching to form the pads 104. Adjacent pads 104 are spaced apart from each other.

Next, step B2 is performed, as shown in FIG. 1F, to form a passivation layer 105 to cover the pads 104 and the substrate 100.

Optionally, the top surface of the passivation layer 105 is higher than the top surface of the pads 104. Thickness of the passivation layer may be any suitable thickness, which is not specifically limited herein.

Optionally, the top surface of the passivation layer 105 can also be selectively chemically ground after depositing the passivation layer 105 to obtain a flat surface.

Next, step B3 is performed to continue, as shown in FIG. 1F, to form openings 106 in the passivation layer 105 above each pad of the pads 104. The openings 106 expose at least a portion of the surface of the pads 104.

In order to achieve the connection of the pads to an external circuitry, the openings 106 are desirable to expose the pad surface and they may be formed using any suitable method. In one example, first a patterned mask is formed on the top surface of the passivation layer 105, such as a photoresist layer. The patterned mask layer defines an open position, a shape, a critical dimension, etc., and then the exposed passivation layer 105 is etched by using the patterned mask layer as a mask until the top surface of the pads 104 is exposed to form the openings 106. After that, the patterned mask layer is removed, for example, by one of an ashing and a wet etching method to remove the mask layer of the photoresist material.

In the disclosed WLSiP packaging method of the present disclosure, other steps may be included according to various embodiments. For example, after the packaging is completed, the substrate may be cut along scribe lines to divide a plurality of the integrated chips on the substrate into separate units. For example, each unit can include a first chip and a second chip that are joined, and the unit forms a system or a subsystem that provides multiple functions, which depends on the functionality of the actual integrated chip.

In this manner, the WLSiP packaging method according to the present disclosure combines a wafer level package and a system package method, and simultaneously realizes the advantages of integration of a plurality of chips and completing package manufacturing on a substrate. Completing the package integration process on the substrate, has the advantages of greatly reducing the area of the package structure, reducing the manufacturing cost, optimizing the electrical performance, and batch manufacturing, can significantly reduce the workload and equipment requirements, and improve the efficiency, yield and performance of the package.

Exemplary Embodiment 4

The present disclosure also provides a method for fabricating a WLSiP package structure according to the second exemplary embodiment. The WLSiP packaging method of the present disclosure is illustrated and explained in detail below with reference to FIGS. 2A to 2E.

In order to avoid repeated descriptions, the method of the embodiment which is different from the parts of the first exemplary embodiment and the third exemplary embodiment is mainly illustrated and explained. For other details that are not explained in detail, reference may be made to the description in the foregoing embodiments.

Figure 2A:
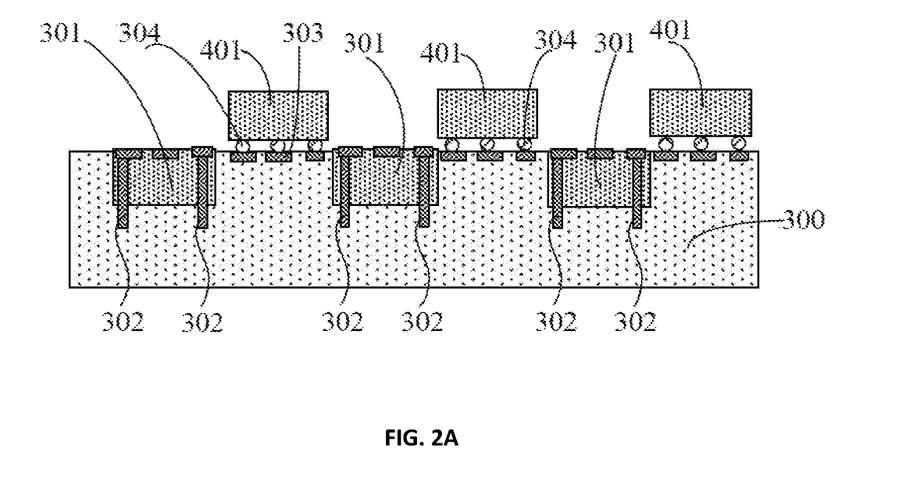
FIGS. 2A to 2E are schematic cross-sectional views of package structures corresponding to certain stages of an exemplary method for forming another package structure consistent with various embodiments of the present disclosure.

As an example, first, step one is performed, as shown in FIG. 2A, to provide a substrate 300 having a plurality of first chips 301 grown by using a semiconductor process.

In one example, before a back side of the substrate is thinned, the substrate 300 further has plugs 302 electrically connected to the plurality of first chips 301. Ends of the plugs 302 extending toward the back side of the substrate 300 are buried under the back side of the substrate 300, that is, the ends of the plugs 302 are buried in the substrate 300.

Optionally, the plugs 302 are disposed in an edge region of the plurality of first chips 301, or other suitable region capable of electrically connecting to the plurality of first chips 301 without affecting the functional realization of the plurality of first chips 301.

In one example, second pads 303 are formed on a front side of the substrate 300. The second pads 303 are electrically connected to the plurality of first chips 301. The second pads 303 are disposed on the surfaces of the plurality of first chips 301, and a portion of the second pads 303 may be disposed on the surfaces of the plugs 302 to be electrically connected to the plugs 302. There are gaps between adjacent second pads 303.

The second pads 303 may be formed using any suitable method. For example, a pad material layer may be formed by a deposition method including, but not limited to, one of a physical vapor deposition method and a chemical vapor deposition method to cover the front side of the substrate 300. After that, an etching method can be used to remove a portion of the pad material layer to form the second pads 303 with a plurality of intervals.

Next, step 2 is performed, referring to FIG. 2A, a plurality of second chips 401 is provided and disposed on the substrate. The plurality of second chips 401 and the plurality of first chips 301 are staggered. Subsequently, an electrical connection structure is formed such that at least one second chip of the plurality of second chips is electrically connected to at least one first chip of the plurality of first chips.

In one example, shown in FIG. 2A, a method of forming the electrical connection structure includes steps C1 through C2.

In Step C1, before the plurality of second chips is placed on the substrate 300, a rewiring (not shown) electrically connected to the at least one first chip of the plurality of first chips 301 is formed on the substrate 300, and a method known to those skilled in the art may be used to form the rewiring layer and may not be described herein.

In Step C2, the plurality of second chips 401 is placed on the substrate 300, the plurality of first chips and the plurality of second chips are staggered from each other, and the two are electrically connected through the rewiring.

In one example, when the plugs 302 are formed in the substrate 300, the rewiring is formed on tops of the plugs 302.

The electrical connection structure to electrically connect the at least one second chip of the plurality of second chips to the at least one first chip of the plurality of first chips includes the plugs 302, the rewiring and the like.

Optionally, a method of placing the plurality of second chips on the substrate 300 includes steps D1 and D2.

In Step D1, form at least one conductive bump on the rewiring.

The conductive bumps 304 may be formed by any suitable method. In one example, when the conductive bumps 304 are solder balls (e.g., tin balls), the solder balls may be placed on a surface of at least one first chip of the plurality of first chips (that is, at a position where the bumps are to be formed) by a ball placement process, and further placed on the corresponding second pads 303. The ball placement process means that the selected solder balls corresponding to the pads are placed on the pads. This process is called ball planting process and the ball planting process can use one of hand bumping and a ball mounter.

Optionally, the ball placement process may be used to cover the surface of the plurality of first chips 301 with a ball net, place the solder balls on the ball net, and pass the solder balls through holes in the ball net to adhere the solder balls to the surface of the plurality of first chips.

Then, through a reflow process, the solder balls are melted to be electrically connected to the plurality of first chips. When the second pads 303 are provided, the solder balls are electrically connected to the second pads 303. As an example, reflow temperature ranges from 200° C. to 260° C., and other suitable temperatures.

In step D2, the plurality of second chips 401 is placed on the conductive bumps 304, and the plurality of first chips 301 and the plurality of second chips 401 are electrically connected through the conductive bumps 304. Alternatively, the second pads 303 may be formed between the conductive bumps 304 and the rewiring.

In an example, solder paste may be deposited on the plurality of first chips (especially on the second pads 303) by screen printing. After the plurality of second chips is correspondingly disposed on the substrate, reflow is performed to achieve the electrical connection between the plurality of first chips and the plurality of second chips.

Figure 2B:
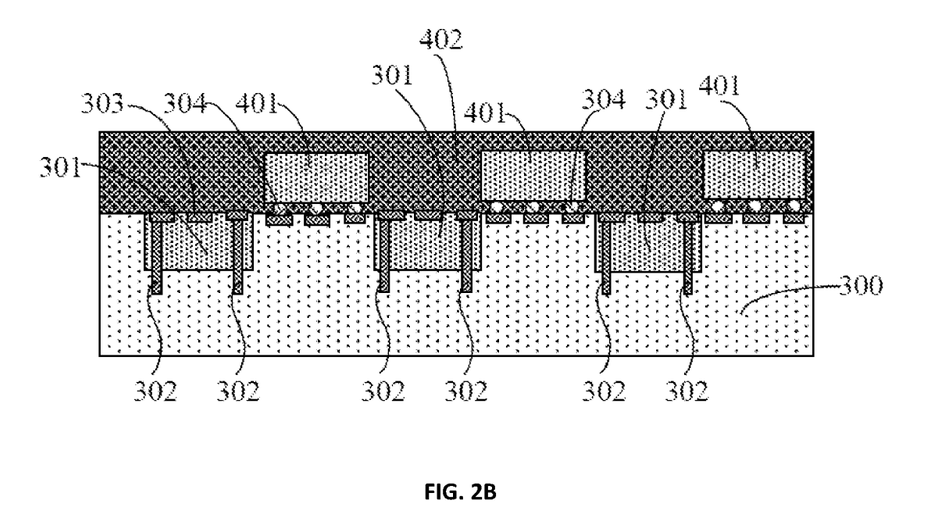

Next, step three is performed, as shown in FIG. 2B, to cover the plurality of second chips 401 and the substrate 300 with an encapsulation material to fix the plurality of second chips 401 on the substrate 300.

Optionally, the encapsulating material may be formed to cover the plurality of second chips 401 and the substrate 300 by an injection molding process, which may be one of a hot press molding process, and other suitable injection molding processes.

In the third step, reference may be made to the description in the third step in the foregoing exemplary Embodiment 3, and details are not described herein.

In one example, the substrate 300 has a front side and a back side, and the encapsulation layer 402 covers the front side, and the plurality of second chips is disposed on the front side of the substrate 300.

In another example, the substrate has a front side and a back side, and the encapsulation layer covers the back side, at which time the plurality of second chips is disposed on the back side of the substrate.

Figure 2C:
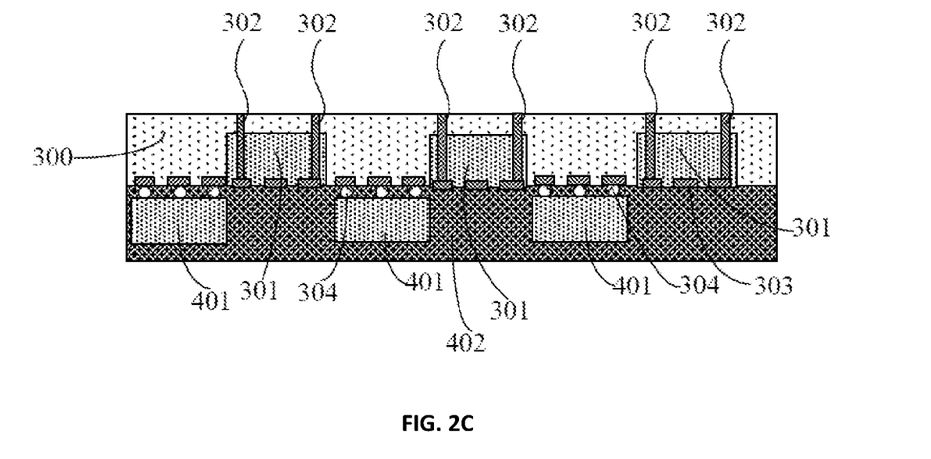

In one example, as shown in FIG. 2C, the substrate 300 further has plugs 302 which are electrically connected to the plurality of first chips 301 and ends of the plugs 302 extending to the back side of the substrate 300 are buried under the back side of the substrate 300. After the encapsulation material covers the plurality of second chips 401 and the front side of the substrate 200, the back side of the substrate 300 is further thinned until the plugs 302 are exposed.

The thinning process can also etch the plugs until thickness of the substrate reaches the target thickness.

The plastic encapsulation layer is usually made of an organic material and the substrate is usually an inorganic material (for example, silicon). These two materials are different and the thermal expansion coefficients are also inconsistent. Therefore the encapsulation method to form the plugs after the encapsulating material covers the plurality of second chips and the front side of the substrate is easy to cause warpage deformation of the package structure, thereby affect the operability and yield of subsequent processes such as grinding, and make it more difficult for the robot to grasp the wafer during wafer transferring between different processes, increase probability of occurrence of chipping and unsuccessful grasping and make more often problems that the plugs are deviated from predetermined positions and the predetermined electrical connection cannot be achieved when the plugs are subsequently formed. In the present disclosure, plugs have been formed before the encapsulation material covers the plurality of second chips and the front side of the substrate. A thinning process is performed after the encapsulation material covers the plurality of second chips and the front side of the substrate. Therefore, various process problems caused by forming the plug connection after the injection molding process (for example electrical connection failure due to warpage as results of the plug position deviation, as well as negative impact on the thinning process due to warpage) can be avoided to improve electric performance.

In another example, before the encapsulation material covers the plurality of second chips and the front side of the substrate, and the plugs are not formed yet in the substrate, the following steps may be performed: thin the back side of the substrate and stop at target thickness; form plugs electrically connected to the plurality of first chips in the substrate, that ends of the plugs are exposed from the back side of the substrate. For a method of the thinning, reference may be made to the aforementioned thinning method. To avoid repetition, no further description is made herein, and the plugs may be formed by the plug forming method in the foregoing example.

In another example, before the second step, that is, before the plurality of second chips is disposed on the substrate, the following steps E1 to E4 may be performed: First, step E1 is performed to thin the back side of the substrate to the target thickness; then, step E2 is performed to provide a support substrate; then step E3 is performed to place the plurality of second chips on the front side of the substrate; finally, step E4 is performed to remove the support substrate. The removal of the support substrate can also be performed after the step of covering the plurality of second chips and the substrate with the encapsulation material to fix the plurality of second chips on the substrate.

Before the step E1 is performed, that is, before the thinning, the substrate further has plugs electrically connected to the plurality of first chips, that ends of the plugs extending to the back of the substrate are buried under the back side, and the plugs are exposed from the back side of the substrate after the thinning.

It may also be that, before the plurality of second chips is placed on the front side of the substrate and after the thinning of step E1 is performed, further steps include: form plugs electrically connected to the plurality of first chips in the substrate, that ends of the plugs are exposed from the back side of the substrate.

In another embodiment, the plurality of second chips may also be disposed on the back side of the substrate. In this case, plugs may have been formed in the substrate, for example, the substrate 300 further has the plugs 302 electrically connected to the plurality of first chips 301, and ends of the plugs 302 extending toward the back side of the substrate 300 are buried under the back side. Before the plurality of second chips is placed on the back side of the substrate, further steps include: thin the back side of the substrate until the plugs are exposed.

In another example, before the plurality of second chips is placed on the back side of the substrate, the following steps can also be performed: thin the back side of the substrate; form plugs in the substrate electrically connected to the plurality of first chips, that ends of the plugs are exposed from the back side of the substrate.

The thinning mentioned in the foregoing examples can be performed by using any suitable process, such as a mechanical grinding process, a chemical mechanical grinding process an etching process, and the like.

The thickness of the thinned substrate can be appropriately set according to an actual process. For example, the thickness of the thinned substrate 300 can be between about 10 μm and about 100 μm, and the thickness may be changed according to different technical nodes. No specific restrictions.

Among them, a method of forming the plugs mentioned in the foregoing examples may be any suitable method, and the methods in the foregoing embodiments may also be used.

Figure 2D:
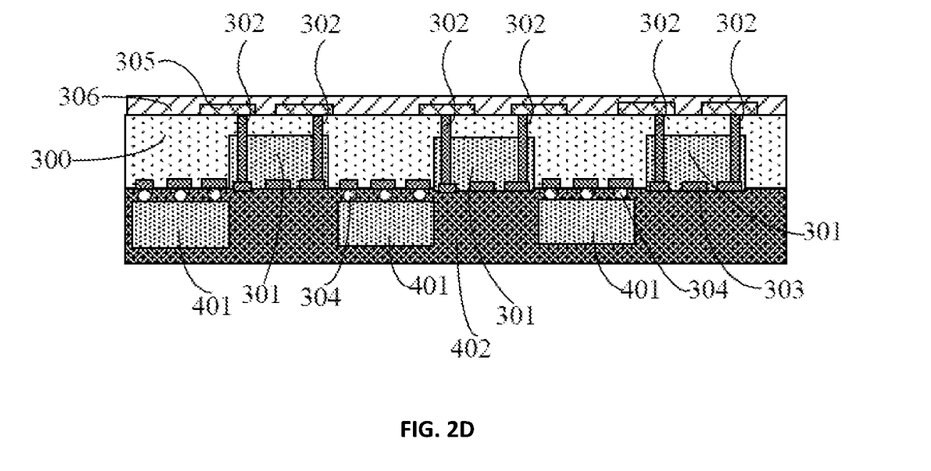
Figure 2E:
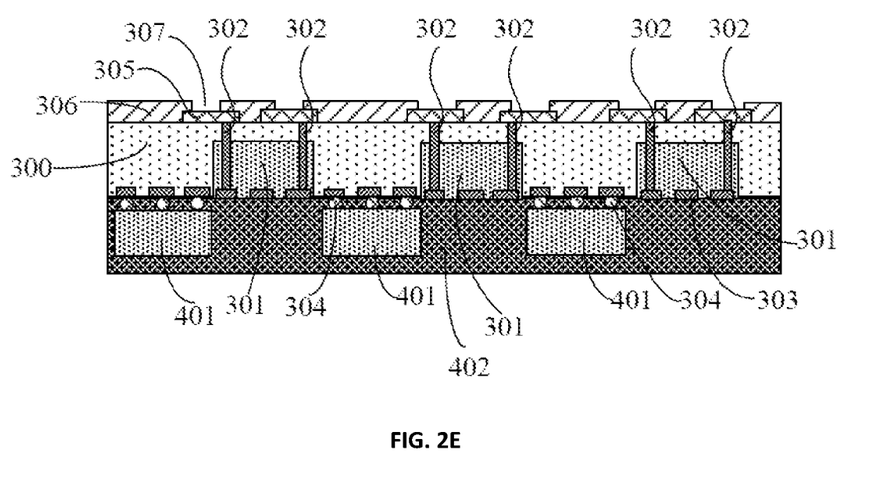

Subsequently, the following steps are performed: first, as shown in FIG. 2D, first pads 305 are formed on the substrate 300. The first pads 305 are located on the other side of the substrate with respect to the plurality of second chips 401. The first pads 305 are electrically connected to the plugs 302. Next, as shown in FIG. 2E, a passivation layer 306 is formed to cover the first pads 305 and the substrate 300. Next, as shown in FIG. 2E, openings 307 are formed in the passivation layer 306 above each of the first pads 305, and the openings 307 expose the first pads 305.

In the disclosed WLSiP packaging method of the present disclosure, other steps may be included without limitation according to various embodiments. For example, after the package is completed, the substrate may be cut along scribe lines to divide a plurality of chips integrated on the substrate into separate independent units, for example, each unit includes a first chip and a second chip that are joined, and the unit forms a system or a subsystem that provides multiple functions, which depends on the functionality of the actual integrated chips.

In this manner, the WLSiP packaging method according to the present disclosure combines a wafer level package and a system package method, and simultaneously realizes advantages of integration of a plurality of chips and completing package manufacturing on a substrate. Completing the package integration process on the substrate has advantages of greatly reducing the area of the package structure, reducing manufacturing cost, optimizing electrical performance, and batch manufacturing, therefore significantly reduces workload and equipment requirements, and improve efficiency, yield and performance of the package.

The present disclosure has been described by the above-described embodiments, but it should be understood that the above-described embodiments are only for the purpose of illustration and description, not intended to limit the present disclosure to the above embodiments. Further, those skilled in the art can understand that the present disclosure is not limited to the above embodiments, and various modifications and changes can be made according to the teachings of the present disclosure. These modifications and modifications are all claimed within the scope of the present disclosure. The scope of the disclosure is defined by the appended claims and their equivalents.

The WLSiP package structure of the present disclosure includes a substrate having a plurality of first chips grown by a semiconductor process; an encapsulation layer embedded with a plurality of second chips, covering the device substrate including the substrate and the plurality of first chips; and an electrical connection structure that electrically connects at least one second chip of the plurality of second chips with at least one first chip of the plurality of first chips. The plurality of first chips grown on the substrate by the semiconductor process and the plurality of second chips is integrated in the WLSiP package structure, therefore the area of the WLSiP package structure can be greatly reduced and better electrical performance can be provided.

The WLSiP packaging method of the present disclosure combines wafer level system packaging and system packaging method and realizes advantages of integration of various chips and packaging manufacturing on the wafer. It can greatly reduce the area of the package structure, reduce manufacturing costs, optimize electrical performance, batch manufacturing, etc., and significantly reduce workload and equipment requirements, therefore improve yield of wafer-level system packaging methods and performance of the resulting package structure.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A wafer-level system-in-package (WLSiP) package structure, comprising:
   a device substrate, including a substrate and a plurality of first chips on the substrate;
   an encapsulation layer, covering the device substrate;
   a plurality of second chips embedded in the encapsulation layer; and
   an electrical connection structure, electrically connecting at least one second chip of the plurality of second chips with at least one first chip of the plurality of first chips, wherein the plurality of first chips and the plurality of second chips are staggered from each other and are located on opposite sides of an interface surface between the device substrate and the encapsulation layer, respectively.

2. The package structure of claim 1, wherein the electrical connection structure comprises:
   plugs formed in the substrate and electrically connected to the plurality of first chips.

3. The package structure of claim 2, wherein the electrical connection structure further comprises:
   a wiring between the plurality of first chips and the plurality of second chips or placed on tops of the plugs.

4. The package structure of claim 3, wherein the electrical connection structure further comprises:
   at least one conductive bump formed between the wiring and the plurality of second chips.

5. The package structure of claim 1 wherein:
   the substrate has a front side and a back side, and
   the encapsulating layer covers one of the front side and the back side of the substrate.

6. The package structure of claim 2, further comprising:
   pads located on a side of the substrate opposite to the encapsulation layer, wherein the pads are electrically connected with the corresponding plugs.

7. The package structure of claim 1, wherein one of a front side and a back side of the plurality of second chips is bonded to the substrate.

8. The package structure of claim 1, wherein
   the plurality of second chips is disposed on the substrate by a bonding layer.

9. The package structure of claim 8, wherein the bonding layer comprises one of a chip bonding film, a dry film, and a photoresist.

10. The package structure of claim 1, wherein the encapsulation layer is a plastic encapsulation layer.

11. A wafer-level system-in-package (WLSiP) packaging method, comprising:
    providing a device substrate, including a substrate and a plurality of first chips on the substrate;
    providing a plurality of second chips on the substrate, wherein the plurality of first chips and the plurality of second chips are staggered from each other;
    forming an electrical connection structure, such that at least one second chip of the plurality of second chips is electrically connected to at least one first chip of the plurality of first chips; and
    covering the plurality of second chips and the substrate with an encapsulation material fix the plurality of second chips on the substrate, wherein the plurality of first chips and the plurality of second chips are located on opposite sides of an interface surface between the device substrate and the encapsulation layer, respectively.

12. The packaging method of claim 11, wherein forming the electrical connection structure comprises:
    forming a wiring that is electrically connected with the at least one first chip of the plurality of first chips on the substrate, before providing the plurality of second chips on the substrate; and
    providing the plurality of second chips on the substrate, such that the plurality of first chips and the plurality of second chips are staggered from each other, wherein the at least one first chip and the at least one second chip are electrically connected by the wiring.

13. The packaging method of claim 12, wherein providing the plurality of second chips on the substrate comprises:
    forming at least one conductive bump on the wiring; and
    placing the plurality of second chips on the at least one conductive bump, wherein the at least one first chip and the at least one second chip are electrically connected by the at least one conductive bump.

14. A wafer-level system-in-package (WLSiP) packaging method, comprising:
    providing a device substrate, including a substrate and a plurality of first chips on the substrate;
    providing a plurality of second chips on the substrate, wherein the plurality of first chips and the plurality of second chips are staggered from each other;
    forming an electrical connection structure, such that at least one second chip of the plurality of second chips is electrically connected to at least one first chip of the plurality of first chips;

covering the plurality of second chips and the substrate with an encapsulation material to fix the plurality of second chips on the substrate; and forming plugs that are electrically connected to the plurality of first chips in the substrate, before the substrate is thinned, wherein ends of the plugs extending toward a back side of the substrate are buried under the back side; and after the encapsulation material covers the plurality of second chips and a front side of the substrate, thinning the back side of the substrate until the plugs are exposed; or before the encapsulation material covers the plurality of second chips and the front side of the substrate, thinning the substrate, followed by forming plugs that are electrically connected to the plurality of first chips in the substrate, wherein ends of the plugs are exposed from the back side of the substrate.

15. The packaging method of claim 11, wherein providing the plurality of second chips on the substrate comprises:
thinning a back side of the substrate;
providing a support substrate and adjoining the support substrate with the back side of the substrate;
placing the plurality of second chips on a front side of the substrate; and
removing the support substrate.

16. The packaging method of claim 15, wherein, after the encapsulating material covers the plurality of second chips and the substrate and the thinning of the substrate, the electrical connection structure is formed by:
forming plugs in the substrate, wherein the plugs include plugs, corresponding to the plurality of first chips, electrically connected to the plurality of first chips, and the plugs further include plugs, corresponding to the plurality of second chips, electrically connected to the plurality of second chips.

17. The packaging method of claim 11, wherein one of a front side and a back side of the plurality of second chips is bonded to the substrate.

18. The packaging method of claim 11, wherein providing the plurality of second chips on the substrate comprises:
bonding the plurality of second chips to the substrate by using a bonding layer there-between.

19. The packaging method of claim 18, wherein the bonding layer comprises one of a chip bonding film, a dry film, and a photoresist.

20. The packaging method of claim 11, wherein the substrate has a front side and a back side, and the encapsulating layer covers one of the front side and the back side.

* * * * *